(12) United States Patent
Peng et al.

(10) Patent No.: US 10,507,428 B1
(45) Date of Patent: Dec. 17, 2019

(54) HEAT-PIPE MEMBRANE MODULE WITH HEAT RECOVERY

(71) Applicant: BEIJING UNIVERSITY OF TECHNOLOGY, Beijing (CN)

(72) Inventors: Yuelian Peng, Beijing (CN); Yue Li, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 16/060,019

(22) PCT Filed: May 24, 2017

(86) PCT No.: PCT/CN2017/085680
§ 371 (c)(1),
(2) Date: Jun. 6, 2018

(87) PCT Pub. No.: WO2018/201532
PCT Pub. Date: Nov. 8, 2018

(30) Foreign Application Priority Data

May 3, 2017 (CN) .......................... 2017 1 0303208

(51) Int. Cl.
*B01D 61/36* (2006.01)
*B01D 63/06* (2006.01)
(Continued)

(52) U.S. Cl.
CPC ......... *B01D 61/366* (2013.01); *B01D 61/362* (2013.01); *B01D 61/364* (2013.01);
(Continued)

(58) Field of Classification Search
None
See application file for complete search history.

(56) References Cited

U.S. PATENT DOCUMENTS

| 3,563,860 A | 2/1971 | Henderyck | .................... 202/172 |
| 3,677,337 A * | 7/1972 | Midolo | ................. F28D 15/025 |
| | | | 165/104.22 |

(Continued)

FOREIGN PATENT DOCUMENTS

| CN | 203155102 U | 8/2013 |
| CN | 104399372 A | 3/2015 |

(Continued)

OTHER PUBLICATIONS

Li, Boyi et al., "New membrane distillation module based on hollow fiber AGMD desalination" CIESC Journal ; vol. 66; No. 1; (Jan. 2015); pp. 149-156.

(Continued)

*Primary Examiner* — Krishnan S Menon
(74) *Attorney, Agent, or Firm* — J.C. Patents

(57) ABSTRACT

A heat-pipe membrane module belongs to a heat recycle device. The heat-pipe membrane module is composed of a membrane module and heat pipes. The whole heat pipe is placed in the membrane module where there is heat can be recycled; or one end of heat pipe is placed in the membrane module where there is heat can be recycled and the other end of heat pipe is outside the membrane module. Here, the heat pipe comprises a metal tube, wick and the working fluid, wherein, both ends of the metal tube have covers; the wick is evenly distributed in the inner surface of metal tube, which has a capillary effect; the working fluid fills the wick. The heat-pipe membrane module mentioned above is simple, cheap, and heat efficiency.

12 Claims, 8 Drawing Sheets

(51) Int. Cl.
  *B01D 63/02* (2006.01)
  *F28D 15/02* (2006.01)
  *H01L 23/427* (2006.01)
  *F25B 15/14* (2006.01)

(52) U.S. Cl.
  CPC ........... *B01D 61/368* (2013.01); *B01D 63/02* (2013.01); *B01D 63/06* (2013.01); *F25B 15/14* (2013.01); *F28D 15/02* (2013.01); *H01L 23/427* (2013.01)

(56) References Cited

U.S. PATENT DOCUMENTS

| | | | | |
|---|---|---|---|---|
| 4,312,402 A | * | 1/1982 | Basiulis | F25B 15/14 165/104.22 |
| 4,365,664 A | * | 12/1982 | Basiulis | B01D 63/10 165/104.22 |
| 4,545,862 A | | 10/1985 | Gore et al. | 203/10 |
| 6,716,355 B1 | | 4/2004 | Hanemaaijer et al. | 210/640 |
| 7,265,979 B2 | * | 9/2007 | Erturk | H01L 23/427 257/713 |
| 2011/0203776 A1 | * | 8/2011 | McAlister | F03G 7/05 165/104.26 |
| 2015/0285563 A1 | * | 10/2015 | Yamashita | F28D 15/046 165/104.26 |

FOREIGN PATENT DOCUMENTS

| | | | | |
|---|---|---|---|---|
| CN | 204544004 U | | 8/2015 | |
| DE | 102004050840 A1 | | 5/2005 | |
| JP | 2012149819 A | * | 8/2012 | ......... F28D 15/0266 |
| JP | 2016-007570 A | | 1/2016 | |

OTHER PUBLICATIONS

Guijt, Caroliene M. et al., "Modelling of a transmembrane evaporation module for desalination of seawater" Elsevier—Desalination; vol. 126; (1999); pp. 119-125.

Guijt, C.M. et al., "Air gap membrane distillation: 2. Model validation and hollow fibre module performance analysis" Elsevier—Separation and Purification Technology; vol. 43; (2005); pp. 245-255.

Meindersma, G.W. et al., "Desalination and water recycling by air gap membrane distillation" Elsevier—Desalination; vol. 187; (2006); pp. 291-301.

Lee, Hanyong et al., "Desalination with a Cascade of Cross-Flow Hollow Fiber Membrane Distillation Devices Integrated with a Heat Exchanger" AIChE Journal; vol. 57; No. 7; (Jul. 2011); pp. 1780-1795.

Geng, Hongxin et al., "Experimental study of hollow fiber AGMD modules with energy recovery for high saline water desalination" Elsevier—Desalination; vol. 344; (2014) pp. 55-63.

Yao, Kun et al., "A continuous-Effect Membrane Distillation Process Based on Hollow Fiber AGMD Module with Internal Latent-Heat Recovery" AIChE Journal; vol. 59; No. 4; (Apr. 2013); pp. 1278-1297.

Lu, Shuang-Jiang et al., "Study on vacuum separate-stage multiple-effect membrane distillation process" Journal of Tianjin Polytechnic University; vol. 32; No. 2; (Apr. 2013).

Liu, Zhiyu et al., "Study on the performance of double-pipe air gap membrane distillation module" Elsevier—Desalination; vol. 396; (2016); pp. 48-56.

The Chinese International Search Report of corresponding international PCT application No. PCT/CN2017/085680, dated Feb. 7, 2018.

* cited by examiner

HEAT-PIPE MEMBRANE MODULE WITH HEAT RECOVERY

CROSS-REFERENCE TO RELATED APPLICATION

This application is a national phase application of international application No. PCT/CN2017/085680 filed on May 24, 2017, which in turn claims the priority benefits of Chinese application No. 201710303208.4, filed on May 3, 2017. The contents of these prior applications are hereby incorporated by reference in their entirety.

TECHNICAL FIELD

The present invention relates to a heat-pipe membrane module with high-efficiency internal heat recovery and belongs to a membrane separation device. The heat-pipe membrane module can be used to recover the latent heat and sensible heat in membrane separation processes, such as membrane distillation, pervaporation, evaporation and the others, where there is a phase transition or a hot liquid.

BACKGROUND OF THE INVENTION

There are some membrane-based separation processes with phase transformation. Membrane distillation (MD) is an example. The mass transfer driving force in the MD process is the vapor pressure difference across the microporous membrane. Hot and cold fluids respectively flow at both sides of membrane. In the hot side, the liquid with a low boiling point volatilizes and cross the porous hydrophobic membrane bulk and condenses at the cold side. Heat transfer exists at same time during mass transfer, which includes heat conduction due to the temperature difference between the hot and cold sides, and latent heat accompanied by vapor transfer. The gained output ratio (GOR) in MD process is low, usually less than 1. External heat exchangers were usually used to achieve heat recycle. For example, (LEE H Y, HE F, SONG L M, et al. Desalination with a cascade of cross-flow hollow fiber membrane distillation devices integrated with a heat exchanger [J]. AICHE Journal 54(7) (2011)1780-1795), and (LU S J, GAO Q J, WU C R, et al. Study on the process of decompressing and grading multi-effect membrane distillation. Journal of Tianjin Polytechnic University 32(2) (2013): 1-6). However, additional external heat exchangers increased the equipment cost, makes the system complex, and a little GOR increase.

Internal heat recovery was realized by inserting a heat recovery unit within a single MD module to increase GOR. In 1971, Henderyckx applied for a patent on the flat-shaped AGMD module with an internal heat recovery mechanism (U.S. Pat. No. 3,563,860). In the flat plate of the AGMD module, the condensate plate, the air gap and the hydrophobic porous membrane formed a "sandwich" form. Seawater was simultaneously directly to flow past the condensate plate in the counter direction and preheated by vapor at the air gap to absorb the latent heat of condensation. After additional heating, the preheated seawater was contacted with the membrane. Subsequently, the seawater was concentrated, and the latent heat was recovered in a module. In 1985, Gore et al. (U.S. Pat. No. 4,545,862) observed that the GOR reached as high as 11.0 for desalination with a spirally wound AGMD module.

In 1999, to develop a low-cost seawater desalination technology, a scientific institution in the Netherlands (TNO) presented a schematic of the countercurrent flow transmembrane evaporation module (AGMD) with latent heat recovery (GUIJT C M, RACZ I C HEUVENJW V, et al. Modelling of a trans-membrane evaporation module for desalination of seawater. Desalination 126(1999) 119-125). This module, later named the Memstill® process, consisted of several vertical microporous, hydrophobic hollow fibers with parallel cooling plates on both sides of the module separated by air gaps. The Memstill® process was patented in 2004 (U.S. Pat. No. 6,716,355B1). In 2005, the simulation results of a mathematical model of the Memstill® process showed that a high flux MD can be obtained at high feed temperatures, narrow gaps and thin membranes. For large air gaps of 3 mm, energy efficiencies of 85-90% were typically obtained, which were slightly below the theoretical values (95-98%) for a small heat loss to the surroundings. (GUIJT C M, MEINDERSMA G W, Reith T, et al. Air gap membrane distillation 2. Model validation and hollow fiber module performance analysis [J]. Separation and Purification Technology 43(3) (2005) 245-255). In 2006, Meindersmaa et al. invented a multi-effect flat-membrane module with heat recovery called the Memstil® system with a water ratio between 9-20 (MEINDERSMAA G W, GUIJT C M, DE HAAN A B. Desalination and water recycling by air gap membrane distillation. Desalination 187(1-3) (2006) 291-301).

In 2013, the Qin Group from Tianjin University used a self-made multi-effect membrane distillation module with high-efficiency internal heat recovery to conduct concentration studies on different concentrations of sodium chloride aqueous solution, and the GOR was up to 12.5 (YAO K, QIN Y, YUAN Y. A continuous-effect membrane distillation process based on hollow fiber AGMD module with internal latent-heat recovery. AICHE Journal 59(2013) 1278-1297). In the same year, Geng et al. designed a membrane distiller to concentrate high-concentration brines, which consisted mainly of hollow fiber porous membranes and hollow fiber dense tubes arranged in parallel and arranged with a partition between membranes and tubes. The thermal efficiency of membrane distillation process was effectively improved to 90% (CN 203155102 U). The GOR got to 6.44 (GENG H, HE Q, WU H, et al. Experimental study of hollow fiber AGMD modules with energy recovery for high saline water desalination [J]. Desalination 344(2014) 55-63). In 2015, Li et al. developed a module with an insulated tubular screen and hollow fiber membrane. The intertwined arrangement of hollow fiber membrane and hollow fiber condensing tubes promoted turbulence and increased the mass transfer and heat transfer coefficients in the boundary, and concentration and temperature polarization effects were weakened. The thermal efficiency of membrane was 94.3% and the GOR was 5.73 in seawater desalination. (LI B Y, WANG J Y, WANG J H, et al. New hollow fiber air gap membrane distillation for seawater desalination, Journal of chemical industry 66 (1) (2015) 149-156). In 2016, Liu et al. inserted a hollow fiber membrane into a capillary copper tube and invented a new double-tube air gap membrane module with a maximum GOR of 6.6 (LIU Z, GAO Q, LU X, et al. Study on the performance of double-pipe air gap membrane distillation module. Desalination 396(2016) 48-56).

Heat pipe is a new heat exchanger with high efficiency, as shown in FIG. 1. It is a closed metal tube without condensable gas. The inner surface of the tube is covered by a wick with capillary structure. The tube was filled with a condensable liquid as working fluid, which can penetrate into the wick by capillary force. When one end of the tube is heated, which is called evaporation end, where the working fluid absorbs heat and vaporizes. The resulting vapor flows to the other end, which is called cold end or condensation end, condenses and releases latent heat. Then the working fluid flows back to the evaporation end in the wick by capillary force. The evaporation-condensation process is repeated inside the heat pipe and the heat is continuously transferred from the evaporation end to the condensation end. Because the heat transfer coefficients in evaporation and condensation are far higher than the convective heat transfer coefficient and the flow resistance loss of vapor is low, the apparent thermal conductivity of heat pipe is hundreds of times of the best metal thermal conductor, it is also called thermal superconductor. Heat pipe is particularly efficient in gas-gas heat transfer process, where convection heat transfer coefficient is low. Furthermore, heat pipe is a closed pipe without moving parts, is resistant to wear, and basically doesn't require maintenance. Heat pipe can almost replace all the heat exchanger. In recent year, heat pipes are widely used to recover waste heat in boiler exhaust to preheat the combustion air.

In this invention, heat pipe replaces the dense membrane in the hollow fiber membrane module with latent heat recovery above-mentioned; and porous membranes are surrounded by heat pipes to form a membrane module with heat recovery. When this novel heat-pipe membrane module is used in a membrane process with phase transition or a high-temperature permeate, for example in the membrane distillation process, the vapor across the porous hydrophobic membrane acts as a heating medium to heat the evaporation end of the heat pipe; the cooling liquid acts as a cooling medium to cool the condensation end. In this way, the vapor generated in membrane distillation continuously heats the cold liquid and the latent heat of vapor is recovered. Since the thermal conductivity of the heat pipe is far higher than that of general polymer film, the heat recovery efficiency of this novel membrane module coupled with heat pipes will be far higher than the above-mentioned membrane module.

When recovering the heat of a high-temperature permeate, which acts as the heating medium, and other cold fluid may act as the cooling medium. In addition to coupling with hollow fiber membranes, heat pipes can also be coupled with other various types of membranes.

CONTENTS OF THE INVENTION

The present invention provides a component structure of a heat-pipe membrane module with heat recovery. This novel membrane module has the advantages of simple structure, convenient operation, and flexible assembly, and can meet the needs of different industrial applications, and effectively improve the thermal efficiency of the membrane process.

The heat-pipe membrane module with heat recovery is composed of a membrane module and heat pipes. The whole heat pipe is placed in the membrane module where there is heat can be recycled; or one end of heat pipe is placed in the membrane module where there is heat can be recycled and the other end of heat pipe is outside the membrane module.

The heat-pipe membrane module with heat recovery comprises a tubular membrane module, a hollow fiber membrane module, a flat membrane module, and so long; and the membranes are hollow fibers, flat membranes, and tubular membranes, respectively. The heat pipe comprises a metal tube, wick and the working fluid, wherein, the metal tube at both ends has covers; the wick are evenly distributed in the inner surface of metal tube, which has a capillary effect; the working fluid fills wick. The cross section of the metal tube of the heat pipe is circular, rectangular or other shapes; the heat pipe is a straight pipe or an elbow.

Single or several heat pipes can be placed in parallel, vertical or at any angle to the membrane.

Further preferably, for a heat-pipe hollow fiber membrane module, the relative position of heat pipes and the hollow fiber membrane module includes one or more of the following ways:

(1) Or heat pipes are straight, which are axially parallel to the hollow fibers, and inside the housing but outside the hollow fibers. One end of heat pipes is inside the hollow fiber module, and the other end extends across one end of module and enters into a heat exchanger.

(2) Or heat pipes are straight, and the heat pipes are perpendicular to the hollow fiber membranes. One end of heat pipes is located inside the shell and outside the hollow fiber, and the other end of heat pipes pass through the housing of the hollow fiber membrane module and enters into a heat exchanger;

(3) Or heat pipes are elbows, one end of heat pipes is axially parallel to the hollow fibers, and inside the housing but outside the hollow fibers, and the other end of heat pipes pass through the housing of the hollow fiber membrane module and enters into a heat exchanger.

Heat pipes are perpendicular or axially parallel to the hollow fiber membranes means the axes of heat pipes are perpendicular or axially parallel to the hollow fiber.

Further preferably, for a heat-pipe flat membrane module, the relative position of heat pipes and flat membrane module includes one or more of the following ways:

(1) Or the heat pipes are straight, one end of heat pipes is located inside a box composed of two parallel flat membranes and four frames, the other end of heat pipes extends outside the box and enters into a heat exchanger. The axis of heat pipes is parallel to the membrane, and parallel to the fluid flow.

(2) Or the heat pipes are completely located in the membrane box composed of two flat membrane and four frames. The axis of heat pipes is parallel to membranes. The liquid flows across the hot pipes along a direction perpendicular to the axis of heat pipes. The heat pipes are straight pipes, or elbows with a right angle or two right angles, and the shape of an elbow with two right angles is ⊔ or ⌐.

Further preferably, for a heat-pipe tubular membrane module, the relative position of heat pipes and tubular membrane module includes one or more of the following ways:

(1) Or the axis of the heat pipe the tubular membrane is parallel, one end of heat pipe is located inside the tube of tubular membrane, and the other end of the heat pipe extends from the end of the tubular membrane. A tubular membrane module is composed of a few tubular membranes arranged in an axially parallel.

(2) Or heat pipes are axially located in the shell of tubular membranes in parallel, and a heat pipe is surrounded by some tubular membranes.

The membrane material is one or more of polymers, such as polytetrafluoroethylene, polyvinylidenefluoride, polysulfone, polystyrene, polydimethylsiloxane, and polyurethane.

The shell of heat pipes is composed of metals, such as stainless steel, copper or aluminum.

One or several circular, square, or other shaped heat pipes are put into the membrane module, and one end of them is close to the membrane surface; the other end is outside the membrane module and contact with the cold fluid. The heat pipe and membrane module are connected and sealed by means of glue or mechanical fixation. When the evaporation end of the heat pipe is heated, the working fluid in the wick absorbs heat to evaporate, and the resulted vapor in the tube flows to the other end and is condensed. The latent heat is released and the resulted working fluid is drawn into the wick by capillary force, and returns to the evaporation end. In this way, continuous heat transfer from hot end to cold end is achieved during evaporation and condensation of the working fluid.

The advantages of the present invention are as follows:

1. The heat-pipe membrane module is simple in structure, low in manufacturing cost and high heat efficiency.

2. One end of heat pipe is put into the membrane module, which not only can recover heat and improve thermal efficiency, but also can greatly disturb the fluid and improve mass transfer.

3. It is suitable for hollow fiber, tubular and flat membrane modules with different sizes.

4. The heat pipe is highly efficient and has a simple structure, a small volume, the shape and size can be flexible.

BRIEF DESCRIPTION OF THE DRAWINGS

FIG. 2a shows a heat pipe with one end parallel to the hollow fiber,
FIG. 2b shows a straight heat pipe parallel to the hollow fiber,
and
  FIG. 2c shows a straight heat pipe perpendicular to the hollow fiber.

FIG. 3a shows a perspective view of a straight heat pipe parallel to the feed,
FIG. 3b shows a cross-section of a straight heat pipe parallel to the feed,
FIG. 3c shows a perspective view of a straight heat pipe perpendicular to the feed,
FIG. 3d shows a cross-section of a straight heat pipe perpendicular to the feed,
FIG. 3e shows a cross-section of a heat pipe with an elbow perpendicular to the feed,
and
  FIG. 3f shows a cross-section of a heat pipe with two elbows perpendicular to the feed.

FIG. 4a shows a tubular membrane module with one heat pipe inside,
FIG. 4b shows a bundle tubular membrane module with heat pipes inside,
FIG. 4c shows a cross-section of a bundle tubular membrane module with heat pipes inside,
FIG. 4d shows a bundle tubular membrane module with heat pipes outside,
and
  FIG. 4e shows a cross-section of a bundle tubular membrane module with heat pipes outside.

1 metal shell; 2 wick; 3 working fluid; 4 cover; 5 evaporation end; 6 condensation end, 7 heat pipe, 8 hollow fiber membrane, 9 flat membrane, 10 tubular membrane, 11 shell, 12 internal frame, 13 external frame.

EMBODIMENTS

Figure 1:
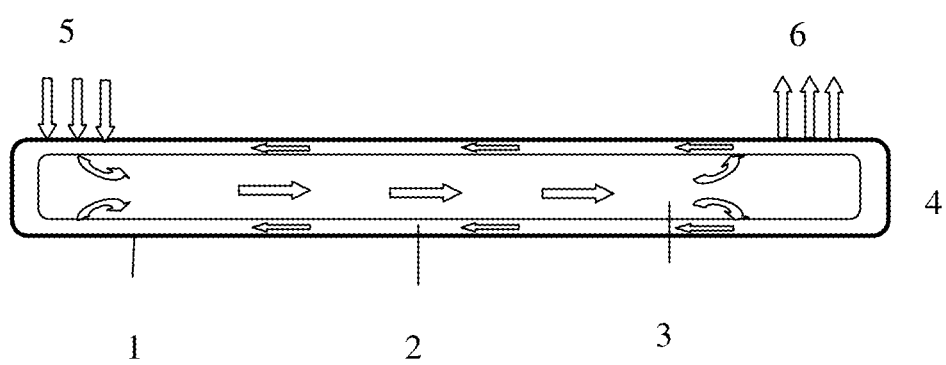
FIG. 1 shows a cross-section A-A of a heat pipe.

The present invention is further exemplified. FIGS. 1, 2a-2c, 3a-3f and 4a-4e illustrate the present invention in detail. As shown in FIG. 1, this is the schematic diagram of section A-A of heat pipe 7. The working principle of heat pipe 7 is as following. The evaporation end 5 of heat pipe 7 is heated by a hot medium, and the condensation end 6 is cooled by a cold medium. The working fluid 3 in the wick 2 absorbs heat and evaporates, and the resulted vapor flows to the condensation end 6 for pressure difference, and the vapor condenses and releases latent heat at the condensation end 6. The resulted working fluid 3 returns to the evaporation end 5 by capillary force along the wick 2. In this way, continuous heat transfer from hot end to cold end is achieved during evaporation and condensation of the working fluid.

Embodiment 1

Figure 2A:
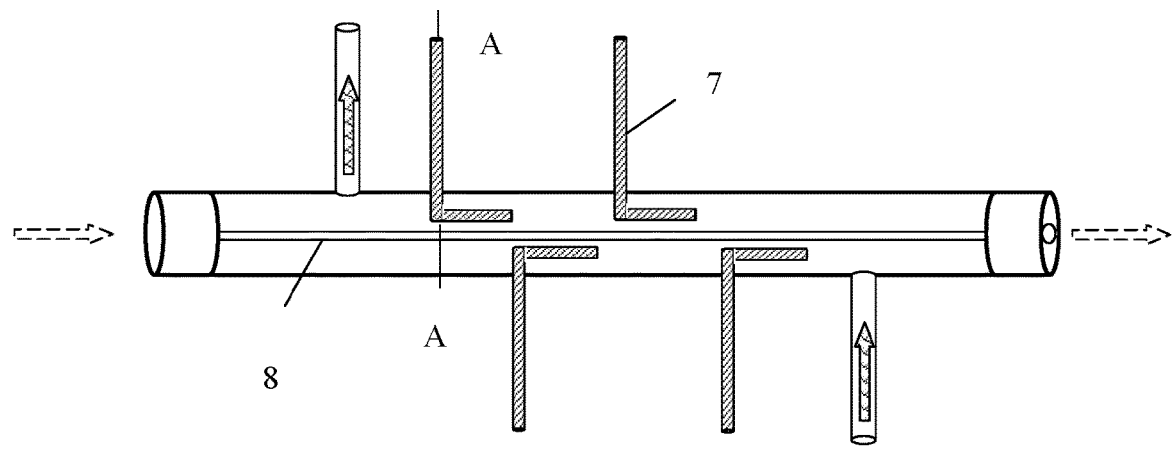
FIGS. 2a-2c are schematic diagram of a heat-pipe hollow fiber membrane module.
Figure 2B:
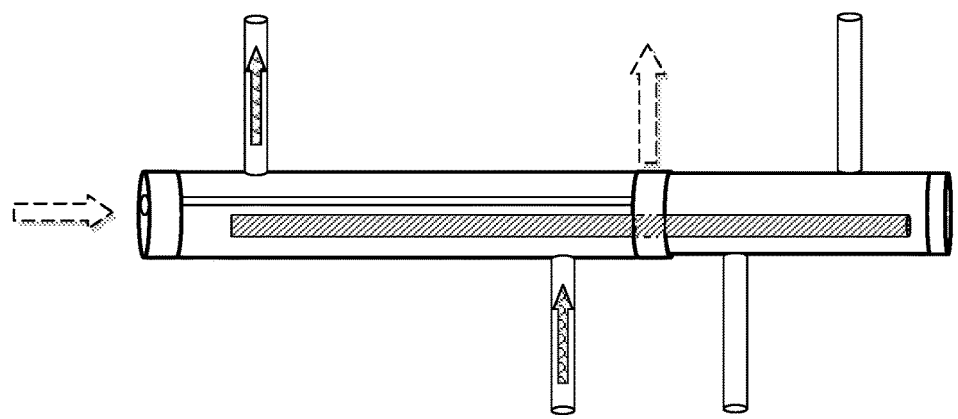
Figure 2C:
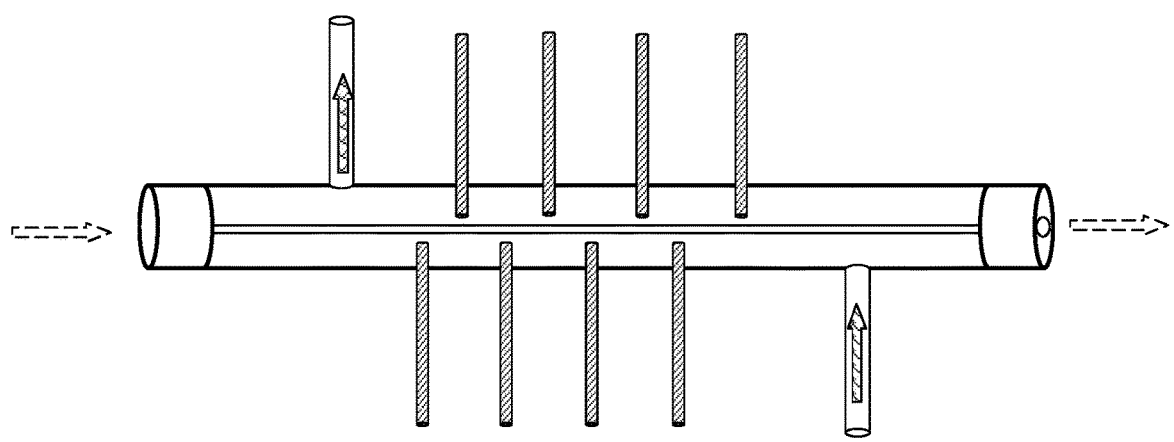

FIGS. 2a-2c show a heat-pipe hollow fiber membrane module. The hollow fiber membrane module includes a tubular shell 11 and hollow fiber membranes 8.

In FIG. 2a, heat pipes are elbows, one end of heat pipes is axially parallel to the hollow fibers, and inside the housing but outside the hollow fibers, and the other end of heat pipes pass through the housing of the hollow fiber membrane module and enters into a heat exchanger.

In FIG. 2b, heat pipes are straight, which are axially parallel to the hollow fibers, and inside the housing but outside the hollow fibers. One end of heat pipes is inside the hollow fiber module, and the other end extends across one end of module and enters into a heat exchanger.

In FIG. 2c, heat pipes are straight, and the heat pipes are perpendicular to the hollow fiber membranes. One end of heat pipes is located inside the shell and outside the hollow fiber, and the other end of heat pipes pass through the housing of the hollow fiber membrane module and enters into a heat exchanger.

Embodiment 2

The schematic diagram of a heat-pipe flat membrane module is shown in FIGS. 3a-3f. The flat membrane module composes some membrane boxes. A membrane box is made of two parallel flat membranes and four frames. The feed flows between the two membranes; the permeate flows outside the membrane box.

Figure 3A:
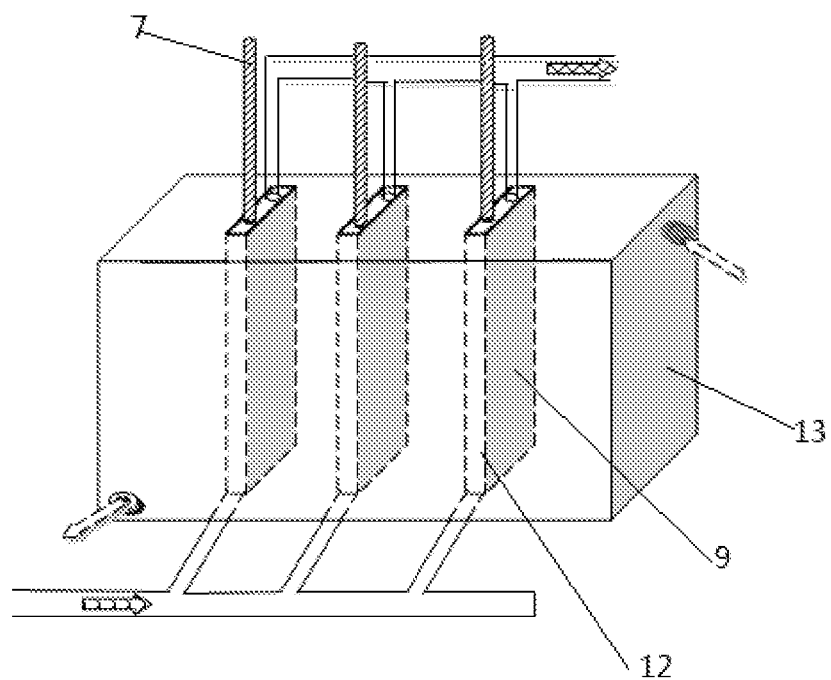
FIGS. 3a-3f are schematic diagram of a heat-pipe flat membrane module.
Figure 3B:
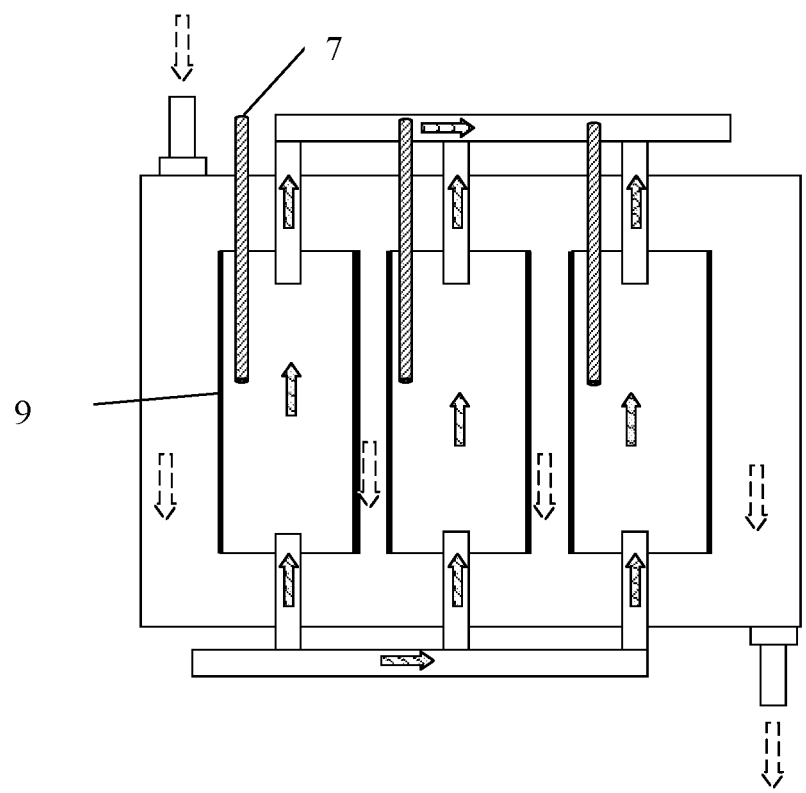

In FIGS. 3a and 3b, the heat pipes are straight, one end of heat pipes is located inside a box composed of two parallel flat membranes and four frames, the other end of heat pipes extends outside the box and enters into a heat exchanger. The axis of heat pipes is parallel to the membrane, and parallel to the fluid flow.

Figure 3C:
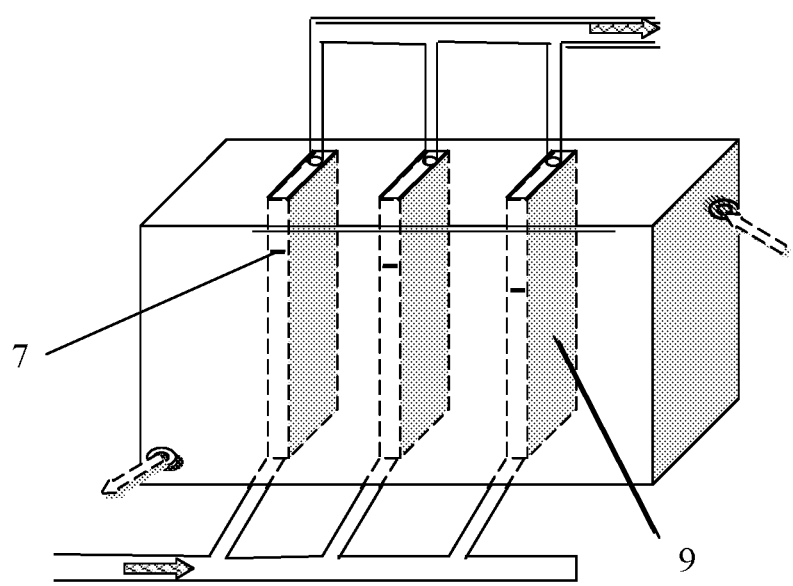
Figure 3D:
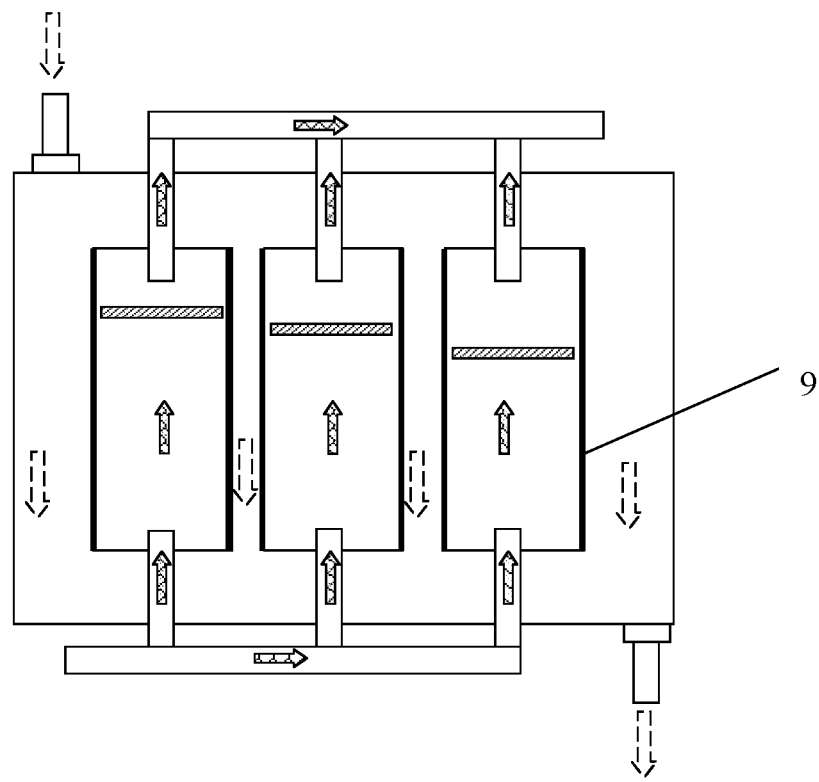
Figure 3E:
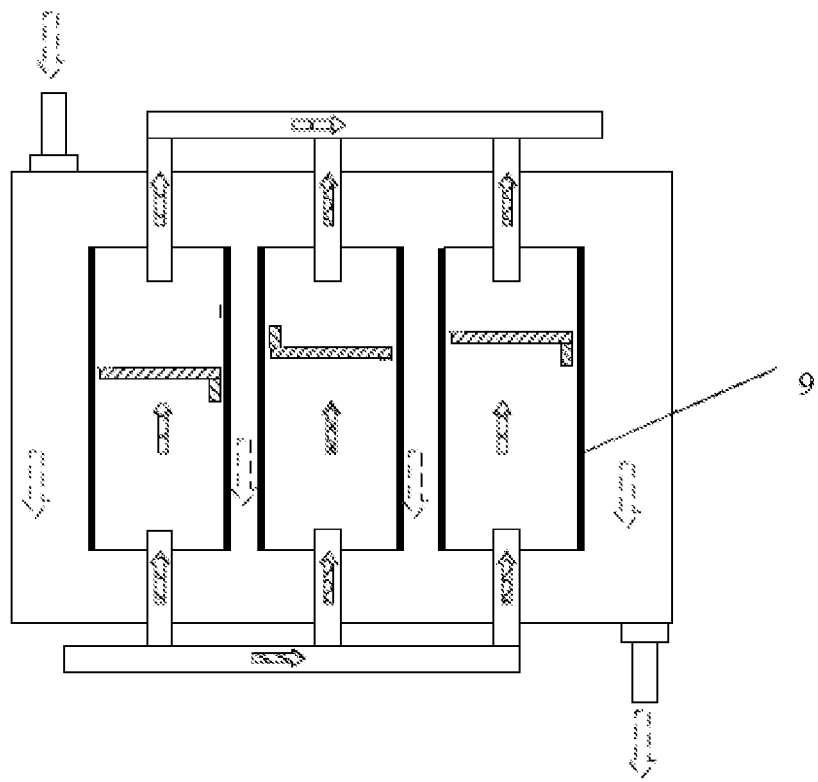
Figure 3F:
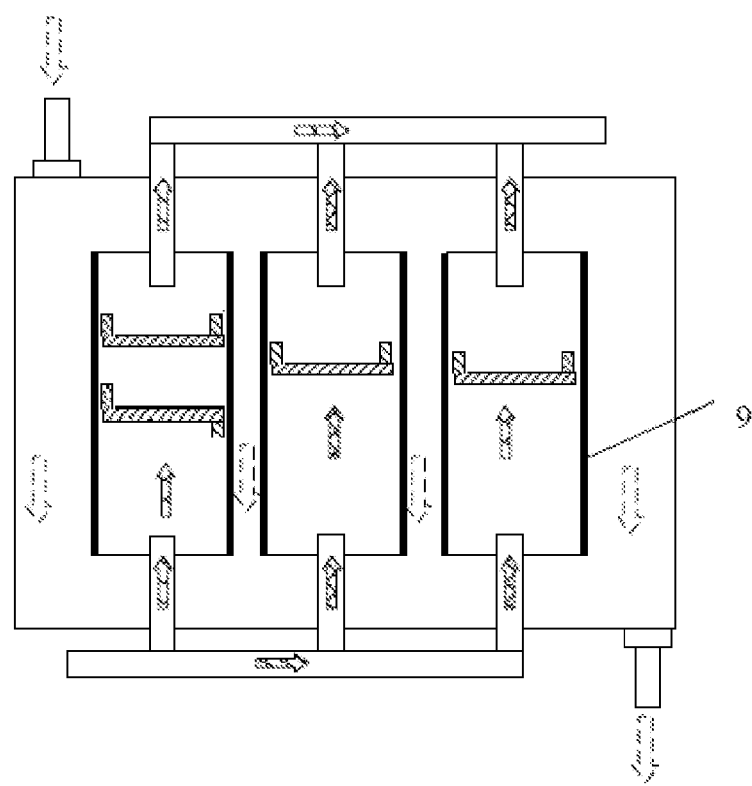

In FIGS. 3c and 3d, the heat pipes are completely located in the membrane box composed of two flat membrane and four frames. The axis of heat pipes is parallel to membranes. The liquid flows across the hot pipes along a direction perpendicular to the axis of heat pipes. The heat pipes are straight pipes, or elbows with a right angle or two right angles, and the shape of an elbow with two right angles is ⌐ or ⌐.

Embodiment 3

FIGS. 4a-4e are the schematic diagram of a heat-pipe tubular membrane module.

Figure 4A:
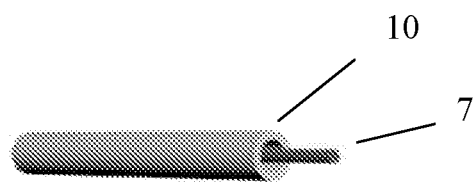
FIG. 4a-4e are schematic diagram of a heat-pipe tubular membrane module.
Figure 4B:
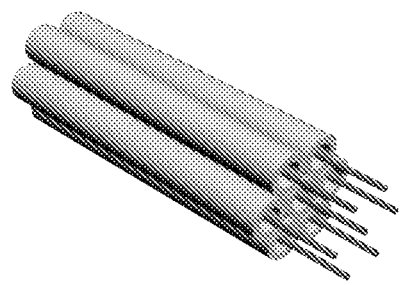
Figure 4C:
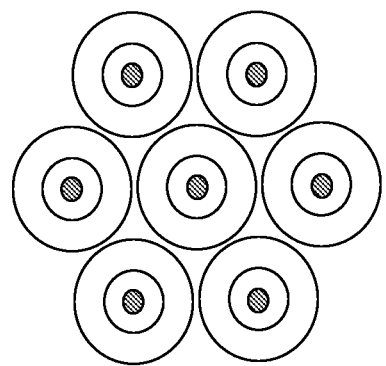

In FIGS. 4a, 4b, and 4c, the axis of the heat pipe and the tubular membrane is parallel, one end of heat pipe is located inside the tubular membrane, and the other end of the heat pipe extends from the end of the tubular membrane. A tubular membrane module is composed of a few tubular membranes arranged in an axially parallel.

Figure 4D:
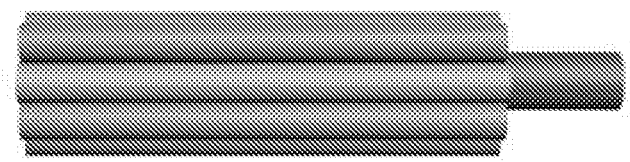
Figure 4E:
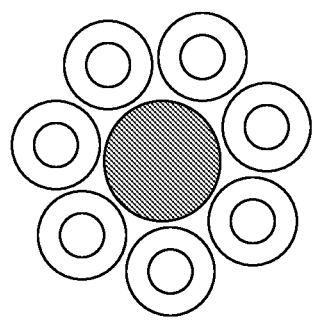

In FIGS. 4d and 4e, heat pipes are axially located in the shell of tubular membranes in parallel, and a heat pipe is surrounded by some tubular membranes.

As shown in FIGS. 2a-2c, 3a-3f, and 4a-4e, vapor or high-temperature permeate act as a heating agent to heat the evaporation end of heat pipe; a cold feed or other low-temperature fluid act as a cooling agent to cool the condensation end of heat pipe. Thus, vapor or high-temperature permeate continuously heat the cold feed or other cold fluid, and the heat is efficiently recovered when the cold and hot fluids don't contact.

The invention claimed is:

1. A heat-pipe membrane assembly comprising a membrane module and a heat pipe, wherein the heat pipe is wholly placed in the membrane module where there is heat to be recycled, or one end of the heat pipe is placed in the membrane module where there is heat to be recycled and the other end of the heat pipe extends outside the membrane module; the heat pipe comprises a metal tube, a wick and a working fluid, each end of the metal tube has a cover; the wick is evenly distributed on an inner surface of the metal tube, which has a capillary effect; the working fluid fills the wick.

2. The heat-pipe membrane assembly according to claim 1, wherein the membrane module in the heat-pipe membrane assembly is a hollow fiber membrane module, a flat membrane module, or a tubular membrane module, and a membrane of the membrane module is a hollow fiber membrane, a flat membrane, or a tubular, accordingly.

3. The heat-pipe membrane assembly according to claim 2,
wherein, for a hollow fiber membrane module, a relative position of the heat pipe and the hollow fiber membrane module includes one or more of the following ways:
(1) the heat pipe is straight, which is axially parallel to the hollow fibers, and inside the housing but outside the hollow fibers, one end of the heat pipe is inside the hollow fiber module, and the other end extends across one end of the hollow fiber module and enters into a heat exchanger; or
(2) the heat pipe is straight, and the heat pipe is perpendicular to the hollow fiber membranes, one end of the heat pipe is located inside the shell and outside the hollow fiber, and the other end of the heat pipe passes through the housing of the hollow fiber membrane module and enters into a heat exchanger; or
(3) the heat pipe is elbows, one end of the heat pipes is axially parallel to the hollow fibers, and inside the housing but outside the hollow fibers, and the other end of the heat pipe passes through the housing of the hollow fiber membrane module and enters into a heat exchanger;
the heat pipe is perpendicular or axially parallel to the hollow fiber membranes means the axes of heat pipes are perpendicular or axially parallel to the hollow fiber; and
for a heat-pipe flat membrane module, the relative position of the heat pipe and the heat-pipe flat membrane module includes one or more of the following ways:

(1) the heat pipe is straight, one end of the heat pipe is located inside a box composed of two parallel flat membranes and four frames, the other end of the heat pipe extends outside the box and enters into a heat exchanger, the axis of the heat pipe is parallel to the membrane, and parallel to the fluid flow; or
(2) the heat pipe is completely located in the membrane box composed of two flat membrane and four frames, the axis of the heat pipe is parallel to membranes, the liquid flows across the hot pipes along a direction perpendicular to the axis of the heat pipe, the heat pipe is straight pipes, or elbows with a right angle, and elbows with two right angles; and for a heat-pipe tubular membrane module, the relative position of the heat pipe and the heat-pipe tubular membrane module includes one or more of the following ways:
(1) the axis of the heat pipe and the tubular membrane is parallel, one end of the heat pipe is located inside the tube of the tubular membrane, and the other end of the heat pipe extends from the end of the tubular membrane, the tubular membrane module is composed of a few tubular membranes arranged in an axially parallel; or
(2) the heat pipe is axially located in the shell of tubular membranes in parallel, and the heat pipe is surrounded by some tubular membranes.

4. The heat-pipe membrane assembly according to claim 3, wherein a shape of the elbow with two right angles is ⌐ or ¬.

5. The heat-pipe membrane assembly according to claim 1, wherein the membrane material is one or more of polytetrafluoroethylene, polyvinylidenefluoride, polysulfone, polystyrene, polydimethylsiloxane, and polyurethane.

6. The heat-pipe membrane assembly according to claim 1, wherein the shell of the heat pipe is metal tube, including stainless steel tube, copper tube or aluminum tube.

7. The heat-pipe membrane assembly according to claim 2, wherein the membrane material is one or more of polytetrafluoroethylene, polyvinylidenefluoride, polysulfone, polystyrene, polydimethylsiloxane, and polyurethane.

8. The heat-pipe membrane assembly according to claim 3, wherein the membrane material is one or more of polytetrafluoroethylene, polyvinylidenefluoride, polysulfone, polystyrene, polydimethylsiloxane, and polyurethane.

9. The heat-pipe membrane assembly according to claim 4, wherein the membrane material is one or more of polytetrafluoroethylene, polyvinylidenefluoride, polysulfone, polystyrene, polydimethylsiloxane, and polyurethane.

10. The heat-pipe membrane assembly according to claim 2, wherein the shell of the heat pipe is metal tube, including stainless steel tube, copper tube or aluminum tube.

11. The heat-pipe membrane assembly according to claim 3, wherein the shell of the heat pipe is metal tube, including stainless steel tube, copper tube or aluminum tube.

12. The heat-pipe membrane assembly according to claim 4, wherein the shell of the heat pipe is metal tube, including stainless steel tube, copper tube or aluminum tube.

* * * * *